United States Patent [19]
Kuroda

[11] Patent Number: 6,023,186
[45] Date of Patent: Feb. 8, 2000

[54] CMOS INTEGRATED CIRCUIT DEVICE AND INSPECTION METHOD THEREOF

[75] Inventor: Tadahiro Kuroda, Yokohama, Japan

[73] Assignee: Kabushiki Kaisha Toshiba, Kawasaki, Japan

[21] Appl. No.: 09/122,489

[22] Filed: Jul. 24, 1998

Related U.S. Application Data

[63] Continuation-in-part of application No. 08/831,193, Apr. 2, 1997.

[30] Foreign Application Priority Data

Apr. 30, 1996 [JP] Japan .................................. 8-109562
Oct. 23, 1997 [JP] Japan .................................. 9-291046

[51] Int. Cl.[7] .................................................. H03K 3/01
[52] U.S. Cl. .......................... 327/534; 327/535; 257/371
[58] Field of Search ............................ 327/530, 534, 327/535, 537, 536; 257/371

[56] References Cited

U.S. PATENT DOCUMENTS

| | | | |
|---|---|---|---|
| 4,791,317 | 12/1988 | Winner et al. .......................... 327/545 |
| 5,159,207 | 10/1992 | Pavlin et al. ............................. 327/534 |
| 5,311,073 | 5/1994 | Dallavalle .................................. 326/21 |
| 5,625,300 | 4/1997 | Sachdev . | |
| 5,838,047 | 11/1998 | Yamauchi et al. ...................... 327/537 |

Primary Examiner—Timothy P. Callahan
Assistant Examiner—An T. Luu
Attorney, Agent, or Firm—Loeb & Loeb LLP

[57] ABSTRACT

A CMOS integrated circuit device enabling accurate inspection of its static power source current includes: a CMOS circuit having a p-channel MOS transistor and an n-channel MOS transistor; a first pad connected to the source of the p-channel MOS transistor; a second pad connected to the source of the n-channel MOS transistor; a p-type diffused region formed in an n-type substrate or n-well having formed the p-channel MOS transistor; an n-type diffused region formed in the p-type substrate or p-well having formed the n-channel MOS transistor; a third pad connected through the p-type diffused region to the n-type substrate or n-well having formed the p-channel MOS transistor; and a fourth pad connected through the n-type diffused region to the p-type substrate or p-well having formed the n-channel MOS transistor.

12 Claims, 7 Drawing Sheets

CMOS INTEGRATED CIRCUIT DEVICE AND INSPECTION METHOD THEREOF

This application is a continuation-in-part of U.S. patent application Ser. No. 08/831,193, filed Apr. 2, 1997.

BACKGROUND OF THE INVENTION

1. Field of the Invention

This invention relates to a CMOS integrated circuit device and a method for inspecting same.

2. Description of the Related Art

In general, a decrease in threshold value of MOSFET increases the current driving power of the MOSFET, hence increases the operation speed of the circuit, and can realize a high-performance LSI accordingly. Otherwise, when the source voltage is decreased to save the consumption power, low power consumption is attained by decreasing the threshold value of MOSFET at no cost of the operation speed of the circuit.

An inspection method monitoring the static power source current to reject defective products is widely used for inspection of CMOS integrated circuits containing CMOS circuits having p-channel MOS transistors and n-channel MOS transistors. This is a method for measuring the power source current under a H or L signal being introduced to the input, to reject chips where a current larger than a predetermined value flows, regarding the phenomenon as an indication of a certain kinds of defects. This method relies on the nature of CMOS circuits that, under no change in the input (static condition), no power source current (static power source current) should flow in CMOS circuit.

However, when the threshold value is increased, the sub-threshold current of MOSFET increases, and a large static power source current flows even in non-defective chips. This results in decreasing the reliability of inspection, and leads to more defective products being mixed with acceptable products in market, or to the need for an additional inspection cost to prevent mixture of defective products.

SUMMARY OF THE INVENTION

It is therefore an object of the invention to provide a CMOS integrated circuit and its inspection method enabling more accurate inspection of the static power source current.

A first mode of the CMOS integrated circuit device according to the invention comprises: a CMOS circuit including a p-channel MOS transistor and an n-channel MOS transistor; a first pad connected to the source of the p-channel transistor; a second pad connected to the source of the n-channel MOS transistor; a p-type diffused region formed in an n-type substrate or n-well in which the p-channel MOS transistor is formed; an n-type diffused region formed in a p-type substrate or p-well in which the n-channel MOS transistor is formed; a third pad connected through the p-type diffused region to an n-type substrate or an n-well in which the p-channel MOS transistor is formed; and a fourth pad connected through the n-type diffused region to the p-type substrate or p-well in which the n-channel MOS transistor is formed.

The CMOS integrated circuit device may further comprises: a second p-type diffused region formed in the n-type substrate or n-well having formed the p-channel MOS transistor and connected to the fourth pad; and a second n-type diffused region formed in the p-type substrate or p-well having formed the n-channel MOS transistor and connected to the third pad.

The first pad may be connected to be applied with a first power source potential. The second pad may be connected to be applied with a second power source potential. The third pad may be connected to be applied with a third power source potential. The fourth pad may be connected to be applied with a fourth power source potential.

The CMOS integrated circuit device may further comprises a control circuit activated by an enable control signal to elevate the potential of the n-type substrate or n-well having formed the p-channel MOS transistor and to lower the potential of the p-type substrate or p-well having formed the n-channel MOS transistor.

A first mode of the method for inspecting the CMOS integrated circuit device according to the invention determines whether the CMOS integrated circuit device is acceptable or not with reference to a current flowing in the first or second pad under a condition made for inspection by applying a first power source potential to the first pad, applying a second power source potential lower than the first source power potential to the second pad, applying a potential higher than the first power source potential to the third pad, and applying a potential lower than the second power source potential to the fourth pad.

A second mode of the CMOS integrated circuit device according to the invention comprises: a CMOS circuit including a p-channel MOS transistor and an n-channel MOS transistor; a first pad connected to the source of the p-channel transistor; a second pad connected to the source of the n-channel MOS transistor; a third pad connected to an n-type substrate or n-well in which the p-channel MOS transistor is formed; a fourth pad connected to a p-type substrate or p-well in which the n-channel MOS transistor is formed; and a control circuit activated by an enable control signal to elevate the potential of the n-type substrate or n-well having formed the p-channel MOS transistor and to lower the potential of the p-type substrate or p-well having formed the n-channel MOS transistor.

A second mode of the method for inspecting the CMOS integrated circuit device according to the invention determines whether the CMOS integrated circuit device is acceptable or not with reference to a current flowing in the first or second pad under a condition made for inspection by first applying a first power source potential to said first pad and applying a second power source potential lower than said first source power potential to said second pad, next inactivating said control circuit in response to said enable control signal, and thereafter applying a potential higher than said first power source potential to said third pad and applying a potential lower than said second power source potential to said fourth pad.

DESCRIPTION OF THE PREFERRED EMBODIMENTS

Figure 1:
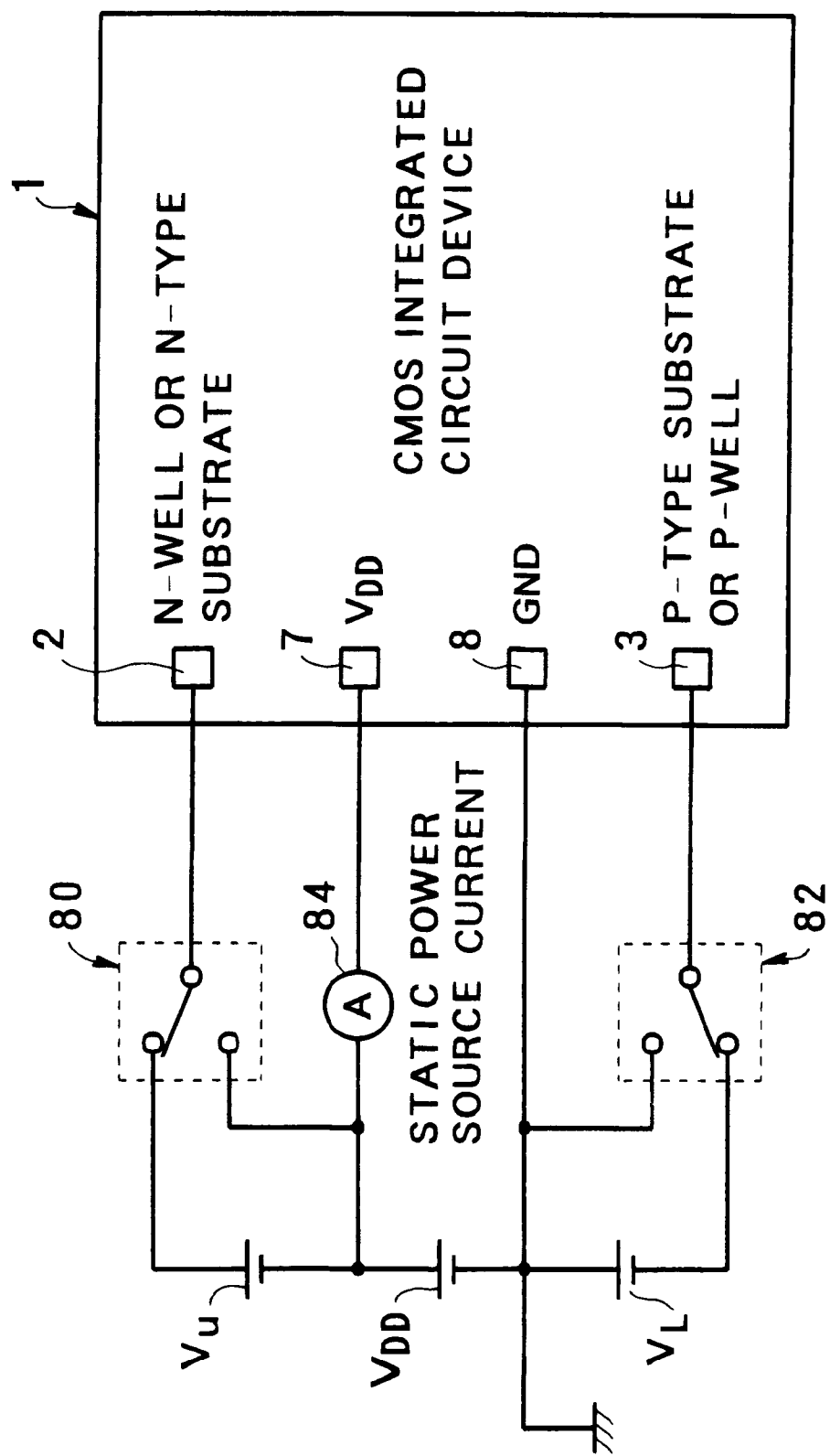
FIG. 1 is a diagram showing the general construction of a CMOS integrated circuit device taken as a first embodiment of the intention.

As shown in FIG. 1, the CMOS integrated circuit device 1 according to the first embodiment of the invention includes at least one p-channel MOS transistor, at least one n-channel MOS transistor, and pads 2, 3, 7, 8. The pad 2 is connected to an n-well or an n-type substrate in which the p-channel MOS transistor is formed (the n-well or the n-type substrate is hereinafter called an n-type semiconductor substrate), the pad 3 is connected to a p-well or a p-type substrate in which the n-channel MOS transistor is formed (the p-well or the p-type substrate is hereinafter called a p-type semiconductor substrate). The pad 7 is for connection to a driving power source $V_{DD}$, and the pad 8 is for connection to the ground power source GND.

Explained below a method for inspecting the static power source current in the CMOS integrated circuit device according to the first embodiment.

During inspection of the static power source current, a low potential $V_L$ lower than the ground potential GND is applied to the p-type semiconductor substrate through a switching circuit 82 via the pad 3, whereas a potential higher than the driving potential $V_{DD}$ is applied to the n-type semiconductor substrate through a switching circuit 80 via the pad 2 (see FIG. 1). Applied to the other pads is the driving potential $V_{DD}$ or the ground potential GND. It results in increasing threshold values of the NMOS transistor formed in the p-type semiconductor substrate and the PMOS transistor formed in the n-type semiconductor substrate due to the back-gate effect. By measuring the static current of the CMOS integrated circuit device 1 under the condition, namely, the current flowing through the pad 7 or the pad 8, for example, using an ammeter 8, any CMOS integrated circuit device exhibiting a larger measured value than a predetermined value can be removed.

Potentials applied to the substrate or well regions vary with characteristics of devices (back-gate effect coefficients and threshold values). In an example, by applying −2V to the p-type substrate or p-type well and +2V to the n-type substrate or n-type well, which increases threshold values of PMOS and NMOS by about 0.4V, for example, the static source power current can be inspected. Although the reference value of the static power source current used for sorting also varies with integration density, an approximately value is around 10 $\mu$A.

For inspection of other factors, the same potentials as applied in practical use of the devices are applied to the pad 2 and the pad 3. Thus, the MOSFET operates following their own characteristics, and enables proper estimation of the performance of the integrated circuit.

When the device is sealed in a package, the pad 3 connected to the p-type substrate or p-type well is bonded to a grounded pin, and the pad 2 connected to the n-type substrate or n-type well is bonded to a power source pin. Thus, in practical use of the device, potentials heretofore applied can be applied to substrates or wells.

Alternatively, when the device is sealed in a package, the pads 3 and 2 may be bonded to independent signal pins to enable inspection of the static power source current in a burn-in reliability test in the manner explained above even after the device is sealed in a package.

When the device is practically used as a product, a desired potential is applied via the pad 3 or pad 2. For example, when the ground potential is applied to the pad 3 and the power source potential to the pad 2, potentials as applied heretofore can be applied to the substrates or wells. Alternatively, when a potential lower than the ground potential is applied to the pad 3, or a higher potential than the power potential is applied to the pad 2, various effects are expected, such as: a) anti-latch-up property, b) decreasing the off-leak current, c) decreasing the capacity at the PN junction, and d) the back-gate effect appearing small. When a higher potential than the ground potential is applied to the pad 3, or a lower potential than the power source potential is applied to the pad 2, some effects are expected, such as: a) higher current driving power of transistors, and b) less variance in threshold voltage.

As explained above, according to the embodiment, since the threshold values of MOS transistors can be set high during inspection of the static power source current, the static power current can be inspected accurately, and defective products can be rejected easily and reliably.

Additionally, a large current does not flow in the semiconductor substrates or well regions in the CMOS integrated circuit device according to the first embodiment. Therefore, it is sufficient to provide a single pad for each, and the wiring to pads may be thin. Wiring to pads can be made easily by using multi-layered wiring technologies.

Figure 2:
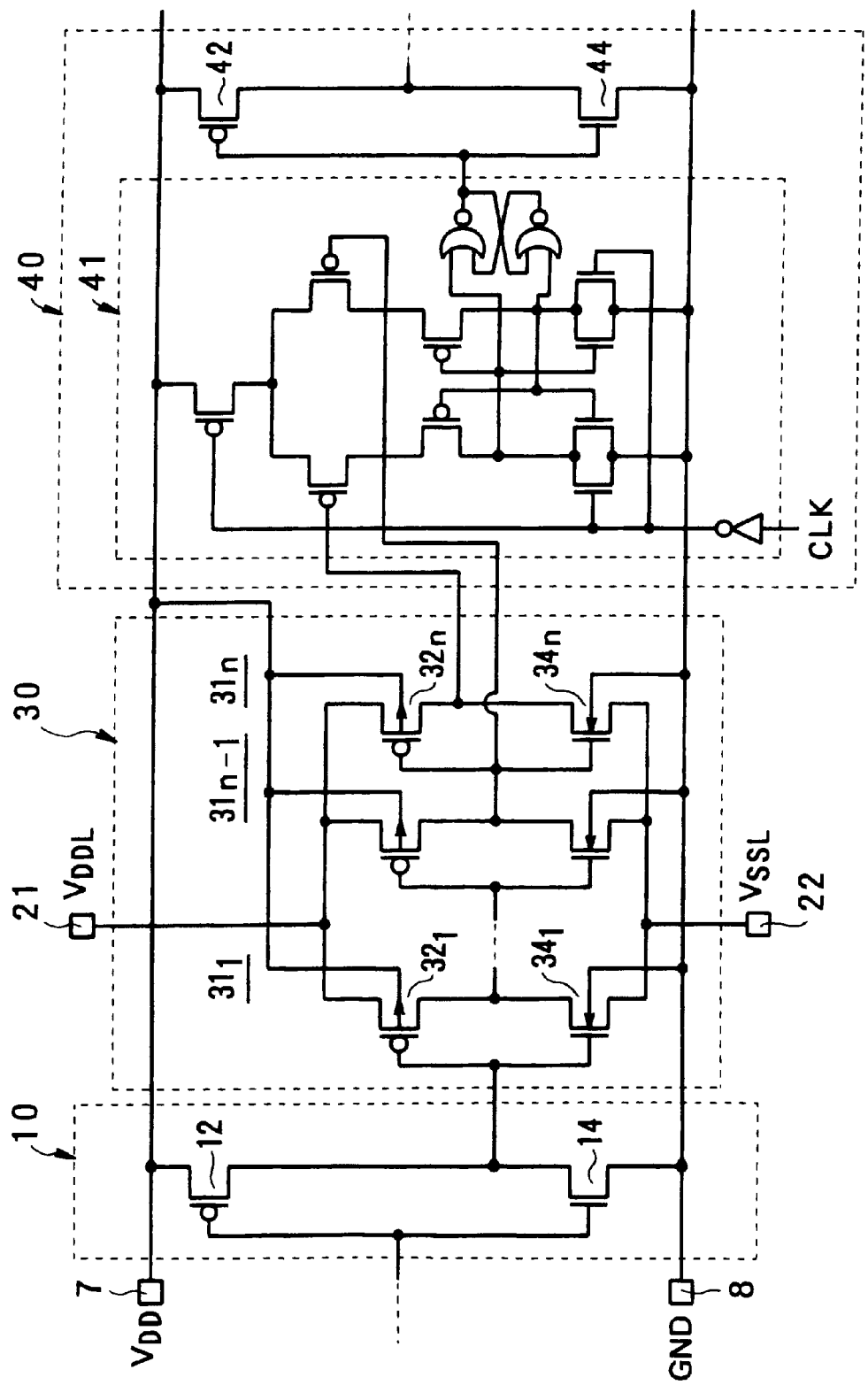
FIG. 2 is a circuit diagram of a CMOS integrated circuit device taken as a second embodiment of the invention.

An arrangement of the CMOS integrated circuit device according to the second embodiment is shown in FIG. 2. The CMOS integrated circuit device shown here includes pads 7, 8, first circuit 10, pads 21, 22 second circuit 30, and third circuit 40. The first circuit 10 includes a CMOS inverter having a PMOS transistor 12 and an NMOS transistor 14. The source of the PMOS transistor 12 is connected to the pad 7 normally applied with the power source potential $V_{DD}$, and also the N-type substrate or n-well having formed the transistor 12 is connected to the pad 7. The source of the NMOS transistor 14 is connected to the pad 8 normally applied with the ground potential GND, and also the p-type substrate or p-well having formed the transistor 14 is connected to the pad 8. The signal in the first circuit has an amplitude between $V_{DD}$ and GND.

The pad 21 is supplied with a potential $V_{DDL}$ ($\leq V_{DD}$) lower than the drive potential $V_{DD}$ both normally and during inspection, and the pad 22 is supplied with a potential VSSL ($\geq$GND) higher than the ground potential GND both normally and during inspection.

The second circuit includes n CMOS inverter circuits $31_1, \ldots 31_n$ connected in series, and each CMOS inverter circuit $31_i$ (i=1, ... n) includes a PMOS transistor $32_i$ and an NMOS transistor $34_i$. The input terminal of the CMOS inverter circuit $31_1$ is connected to the output terminal of the CMOS inverter circuit of the first circuit 10. The output terminal of each CMOS inverter circuit $31_i$ (i=1, ... n−1) is connected to the input terminal of each next CMOS inverter circuit $31_{i+1}$. Sources of PMOS transistors $32_i$ (i=1, ... n) is connected to the pad 21, and the n-type substrate or n-well having formed these PMOS transistors $32_1, \ldots 32_n$ is connected to the pad 7. Sources of NMOS transistors $34_i$ (i=1, ... n) are connected to the pad 22, and the p-type substrate or p-well having formed these transistors $34_1, \ldots 34_n$ is connected to the pad 8. Therefore, the signal in the second circuit has an amplitude between $V_{DD}$ and $V_{SSL}$.

The third circuit 40 includes a latch-type sense-amplifier/flip-flop circuit 41 and a CMOS inverter circuit having a PMOS transistor 42 and an NMOS transistor 44. The latch-type sense-amplifier/flip-flop circuit 41 is a latch-type sense-amplifier typically used as a sense-amplifier of a memory, and it detects a signal with a small amplitude, holds the result in the flip-flop circuit as a data of the potential $V_{DD}$ or GND to convert it in level to a signal with an amplitude between $V_{DD}$ and GND. Its detail is found in "200 MHz Video Compression Macrocells Using Low-Swing Differential Logic", Matsui M. et al., ISSCC Dig. Tech. Papers, pp 76–77, Feb. 1994.

In the embodiment shown here, the sense-amplifier circuit 41 introduces, as its input signal, the potential at the output end and the input end of the last-stage CMOS inverter circuit $31_n$ of the second circuit, and supplies an output through the flip-flop circuit to the CMOS inverter circuit having the PMOS transistor 42 and the NMOS transistor 44. The CMOS inverter circuit and the latch-type sense-amplifier/flip-flop circuit 41 is driven by the power source potential $V_{DD}$ and the ground potential GND. Therefore, the output signal from the third circuit 40 results in having an amplitude between $V_{DD}$ and GND.

The p-type substrate or p-well having formed the NMOS transistor forming the third circuit is connected to the ground power source GND, and the n-type substrate or n-well having formed the PMOS transistor is connected to the driving power source. Threshold values of the transistors forming the first and third circuits are set high, but threshold values of the transistors in the second circuit are set low to enable their high-speed operation even under a low potential.

Next explained is a method of inspecting the static source power current in the CMOS integrated circuit device, especially in the second circuit 30, according to the second embodiment of the invention. Assume here that $V_{DD}$=3.0V, $V_{DDL}$=1.0V, and $V_{SSL}$=0V. During inspection of the static power source current, a potential (–2V, for example) lower than the potential GND during normal use is applied to the pad 8, and a potential (5V, for example) higher than the potential $V_{DD}$ during normal use (3V, for example) is applied to the pad 7. The pad 21 is applied with $V_{DDL}$, and the pad 22 with $V_{SSL}$. As a result, back-gate of –4V and back-gate of –2V are applied to the PMOS transistors $32_i$ (i=1, ... n) and NMOS transistors $34_i$ (i=1, ... n) in the second circuit 30, respectively. These back-gate values are larger than back-gate values during normal use. Back-gate values during normal use of the device, are –2V for PMOS transistors $32_i$ (i=1, ... n) and 0V for NMOS transistors $34_i$ (i=1, ... n).

Therefore, the threshold values of the transistors forming the second circuit 30 are raised during inspection of the static power current, and enable accurate inspection thereof. The static current can be known by measuring the current flowing through the pad 21 or pad 22. If a value larger than the predetermined value is measured, the product is rejected.

During the inspection, the signal from the first circuit 10 to the second circuit 30 exhibits a potential lower than $V_{SSL}$ applied to the second circuit 30, or higher than $V_{DDL}$. However, no d.c. source power flows in the circuit at the input stage of the second circuit 30.

The signal from the second circuit 30 to the third circuit 40 is one of the potential $V_{DDL}$ or $V_{SSL}$ between the driving potential $V_{DD}$ of the third circuit 40 and GND. However, by maintaining the clock signal CLK at "L" (=GND), the d.c. power source is prevented from flowing into the sense-amplifier circuit 41 at the first stage of the third circuit 40. Since the sense-amplifier circuit 41 outputs a signal of the level $V_{DD}$ or GND, the d.c. power source does not flow into other circuits, either, subsequent to the sense-amplifier circuit 41.

In the first and second embodiments, the pads are used to apply a lower potential than the potential during normal use to the p-type substrate or p-well and a higher potential than the potential during normal use to the n-type substrate or n-well during inspection of the static power current. Instead, a device including a substrate potential generating circuit 50 and a switching circuit 60 as shown in FIG. 3 may be used.

Figure 3:
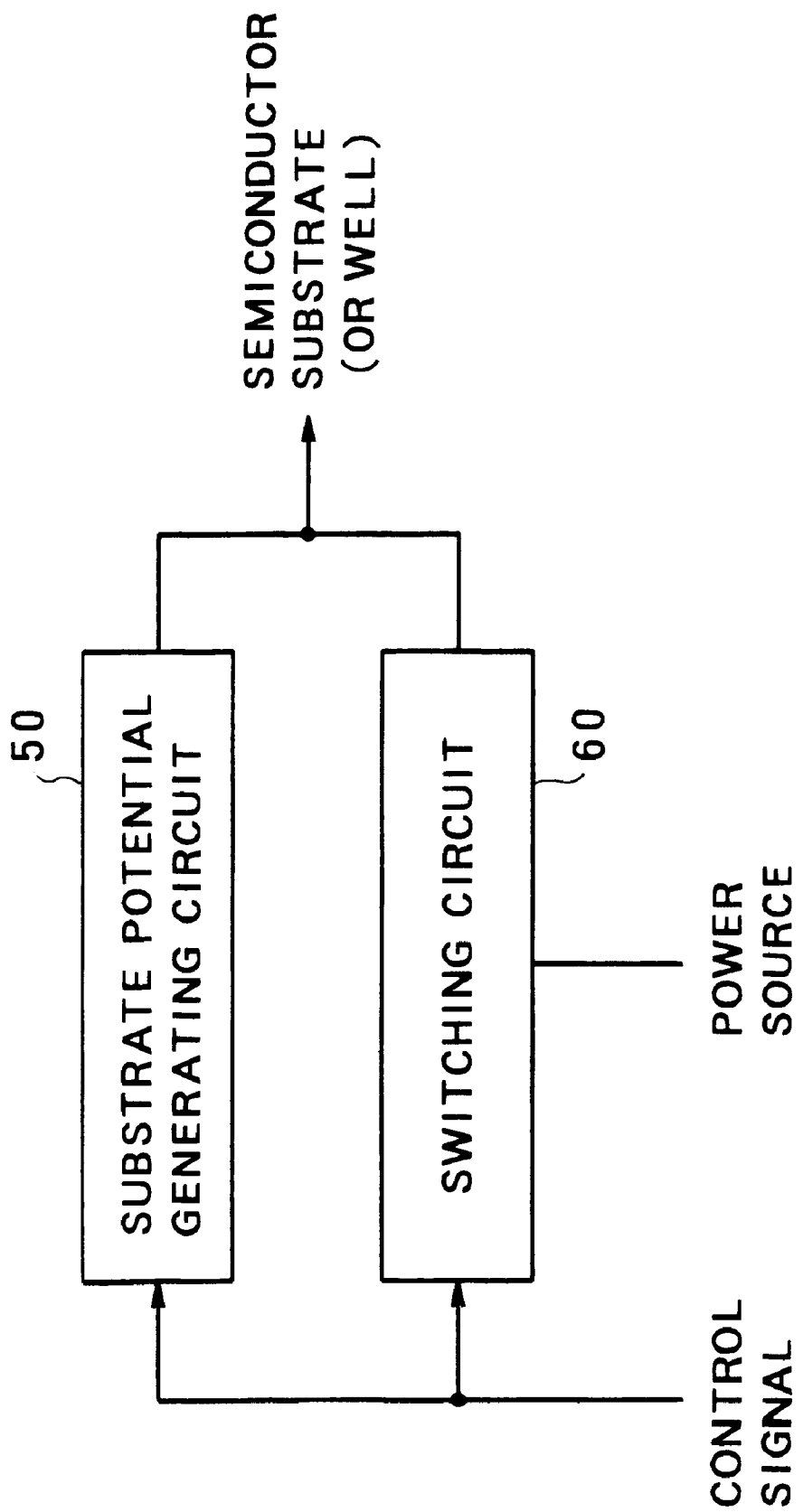
FIG. 3 is a block diagram of an apparatus used in an inspection method according to the invention.

When using the device shown in FIG. 3 is used, during normal use, the semiconductor substrate is connected to the source power while maintaining the substrate potential generating circuit 50 OFF and the switch circuit 60 ON by mans of a control signal. During inspection of the static power current, the control signal turns the switching circuit 60 OFF and the substrate potential generating circuit 50 ON to decrease the potential of the p-type substrate or p-well and elevate the potential of the n-type substrate or n-well.

Needless to say, the device including the substrate potential generating circuit 50 and the switching circuit 60 must be provided individually for the PMOS transistors and for the NMOS transistors. These devices are formed on a chip on which the CMOS integrated circuit device to be inspected is formed.

The device shown in FIG. 3 is disclosed in greater detail in Japanese Patent Application No. 8-80122 in the name of the present Applicant.

When inspecting the static power source current using the device, the other input signals are not changed. The static power source current is measured in this condition, and if a value larger than the predetermined value is measured, the CMOS integrated circuit device is rejected. Thus, the static power source current can be inspected accurately.

Figure 4:
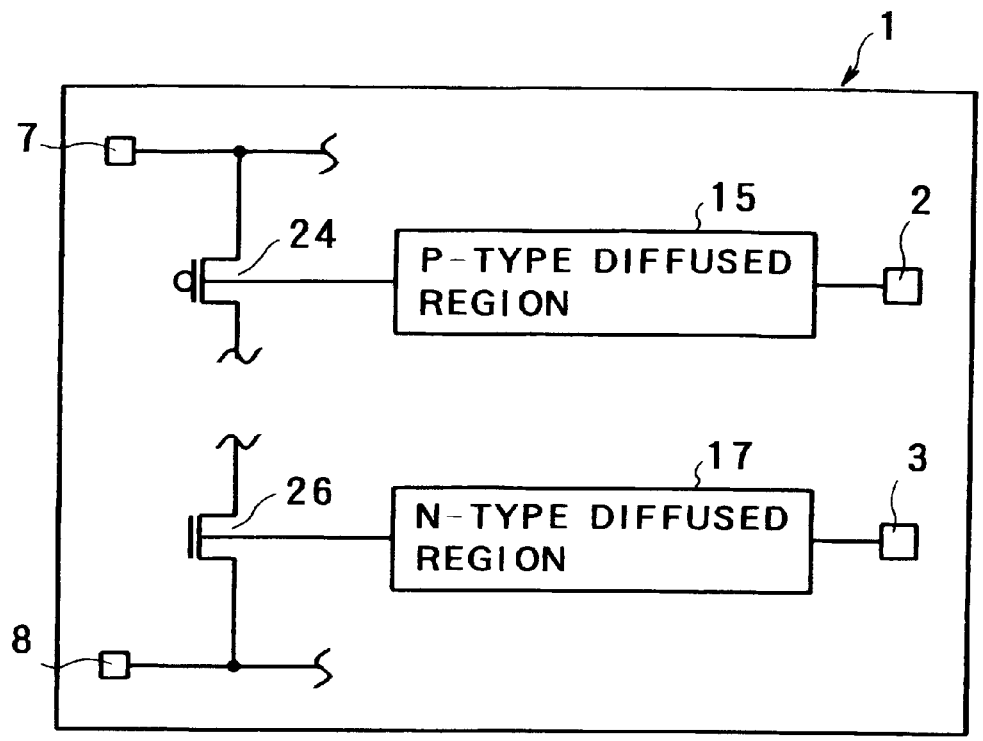
FIG. 4 is a diagram showing the general construction of a CMOS integrated circuit device taken as a third embodiment of the invention.
Figure 5:
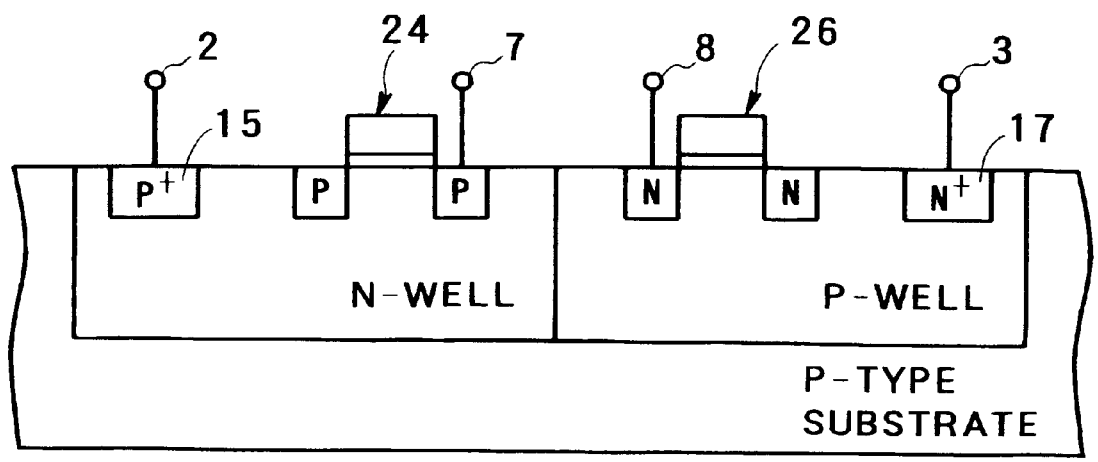
FIG. 5 is a cross-sectional view of the CMOS integrated circuit device according to the third embodiment.

An arrangement of the CMOS integrated circuit device taken as the third embodiment of the invention is shown in FIG. 4. The CMOS integrated circuit device 1 shown here includes pads 2, 3, 7, 8, p-diffused region 15, n-diffused region 17, and a CMOS circuit having at least one p-channel MOS transistor 24, at least one n-channel MOS transistor 26. The p-channel MOS transistor 24 is formed on an n-type semiconductor substrate, and the n-channel MOS transistor 26 is formed on a p-type semiconductor substrate (see FIG. 5). The n-type semiconductor substrate also has formed a p-diffused region 15, and the p-type semiconductor substrate has formed an n-diffused region 17, as shown in FIG. 5.

The pad 2 is connected to the n-type semiconductor substrate via the p-diffused region 15, and the pad 3 is connected to the p-type semiconductor substrate via the n-diffused region 17. The pad 7 is for connection the driving power source $V_{DD}$, and the pad 8 is for connection to the ground power source GND.

Next explained is a method for inspecting the static power current in the CMOS integrated circuit device according to the third embodiment.

Upon inspection of the static power source current, similarly to inspection of the CMOS integrated circuit device according to the first embodiment, a potential higher than the driving power source $V_{DD}$ is applied to the pad 2, and a potential lower than the ground potential GND is applied to the pad 3. As to the other pads, the drive power potential $V_{DD}$ is applied to the pad 7, and the ground potential GND is applied to the pad 8, for example.

At that time, the potential of n-type semiconductor substrate having formed the p-channel MOS transistor 24 exhibits a value $(V_2-V_F)$ which is the potential $V_2$ of the pad 2 minus the seal voltage at the pn junction, namely, the voltage $V_F$ (about 0.6V) where a forward current begins to flow), and the potential of the p-type semiconductor substrate having formed the n-channel MOS transistor 26 exhibits a value $(V_3+V_F)$ which is the potential of the pad 3 plus $V_F$.

Thus, both the threshold value of the NMOS transistor formed in the p-type semiconductor substrate and the threshold value of the PMOS transistor formed in the n-type semiconductor substrate are elevated due to the back-gate effect. Under the condition, the static current of the CMOS integrated circuit device 1, namely, the current flowing through the pad 7 or pad 8, for example, is measured similarly to the first embodiment, and CMOS integrated circuit devices exhibiting larger values than the predetermined value are rejected.

For other tests, the same potentials as those which will be applied in actual use are applied to the pad 2 and pad 3. As a result, the MOS transistors 22, 24 operate according to their own characteristics, and the true performance of the integrated circuit can be estimated.

When the device is sealed in a package, the pad 3 is bonded to a grounded pin, and the pad 2 is bonded to a power source pin. Thus, in practical use of the device, potentials heretofore applied can be applied to substrates or wells.

Alternatively, when the device is sealed in a package, the pads 3 and 2 may be bonded to independent signal pins to enable inspection of the static power source current in a burn-in reliability test in the manner explained above even after the device is sealed in a package.

When the device is practically used as a product, a desired potential is applied via the pad 3 or pad 2. For example, when the ground potential is applied to the pad 3 and the power source potential to the pad 2, potentials as applied heretofore can be applied to the substrates or wells. Alternatively, when a potential lower than the ground potential is applied to the pad 3, or a higher potential than the power potential is applied to the pad 2, various effects are expected, such as: a) anti-latch-up property, b) decreasing the off-leak current, c) decreasing the capacity at the PN junction, and d) the back-gate effect appearing small. When the ground potential is applied to the pad 3, some effects are expected, such as: a) higher current driving power of transistors, and b) less variance in threshold voltage.

As explained above, according to the embodiment, since the threshold values of MOS transistors can be set high during inspection of the static power source current, the static power current can be inspected accurately, and defective products can be rejected easily and reliably.

The CMOS integrated circuit device according to the third embodiment has the additional advantage, a higher anti-latch-up property than the CMOS integrated circuit device according to the first embodiment shown in FIG. 1, for the reason explained below.

Assume here that a current is introduced from the exterior into the CMOS integrated circuit device 1, namely, the potential of the pad 3 is made higher than the potential of the pad 8, for example.

In this case, in the CMOS integrated circuit device 1 according to the first embodiment, the potential of the p-type semiconductor substrate becomes higher than the source of the n-channel MOS transistor. It results in applying a forward voltage at the pn junction and in permitting a current to flow easily from the pad 3 and to latch up the circuit. In contrast, in the CMOS integrated circuit device 1 according to the third embodiment, the potential of the pad 3 is applied to the p-type semiconductor substrate via the n-diffused region 17. Therefore, the voltage is not forward, and seldom latches up the circuit.

Similarly, assume here that a current flows from the interior of the CMOS integrated circuit device 1 to the exterior, namely, the potential of the pad 2 is made lower then the potential of the pad 7, for example. In the first embodiment, the potential of the n-type semiconductor substrate decreases below the potential of the source of the p-channel MOS transistor. It produces the same result as that by applying a forward voltage at the pn junction, and a current flows from the source of the p-channel MOS transistor into the n-type semiconductor substrate, and it apt to latch up the circuit. In contrast, in the third embodiment, since the potential of the pad 2 is applied to the n-type semiconductor substrate through the p-diffused region 15, the voltage is not forward, and unlikely to latch up the circuit.

Figure 6:
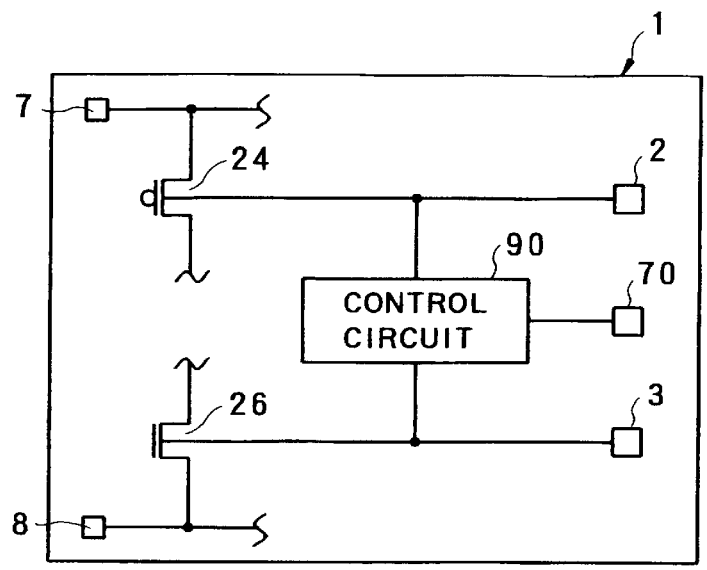
FIG. 6 is a diagram showing the general construction of a CMOS integrated circuit device taken as a fourth embodiment of the invention.

Next shown in FIG. 6 is an arrangement of the CMOS integrated circuit device according to the fourth embodiment of the invention. The CMOS integrated circuit 1 shown here includes a control circuit 90 in addition to the CMOS integrated circuit according to the first embodiment shown in FIG. 1.

The control circuit 90 operates in response to an enable control signal introduced from the exterior through a pad 70, so as to turn off the CMOS integrated circuit device during inspection and to turn it on after inspection. When the control circuit 90 is on, the potential of the n-type semiconductor substrate having formed the p-channel MOS transistor 24 is higher than the potential of the driving power source $V_{DD}$, and the potential of the p-type semiconductor substrate having formed the n-channel MOS transistor 26 is lower than the potential of the ground power source GND.

Figure 7:
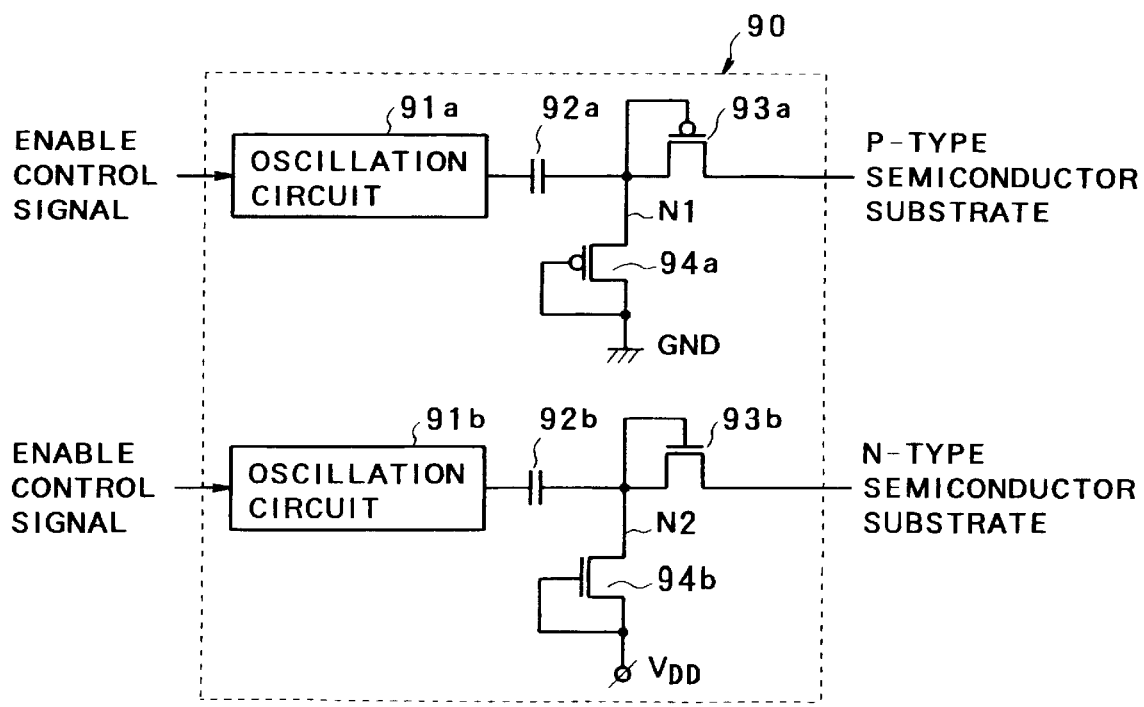
FIG. 7 is a circuit diagram showing a specific arrangement of a control circuit for the CMOS integrated circuit device according to the fourth embodiment of the invention.

A specific arrangement of the control circuit 90 is shown in FIG. 7. The control circuit 90 includes oscillator circuits 91a, 91b responsive to an enable control signal to generate pulse voltages, capacitors 92a, 92b, p-channel MOS transistors 93a, 94a, and n-channel MOS transistors 93b, 94b.

Explained below is the aspect when the potential of the p-type semiconductor substrate is decreased. When the enable control signal becomes H, the oscillator circuit 91a, which may be a ring oscillator, is activated to periodically raise and lower the potential at one end of the capacitor 92a connected to the output end of the oscillator circuit 91a. Accordingly, the potential at a node N1 connecting the p-channel MOS transistors 93a and 94a also changes up and down. When the potential at the node N1 becomes lower than the sum of the potential of the p-type semiconductor substrate and the threshold voltage of the p-channel transistor 93a, the p-channel MOS transistor 93a turns on, and a current flows from the p-type semiconductor substrate to the node N1. At that time, the p-channel MOS transistor 94a remains off. When the potential at the node N1 is elevated by the oscillator circuit 91a and becomes higher than the threshold voltage of the p-channel MOS transistor 94a, the p-channel MOS transistor 94a turns on, and a current flows from the node N1 to the ground power source GND. At that time, p-channel MOS transistor 93 remains off. By repeating these behaviors, electrons flow from the ground power source GND to the p-type semiconductor substrate, and decreases the potential of the p-type semiconductor substrate. When the enable control signal is L, the oscillator circuit 91a is inactivated, and the potential at the node N1 becomes a value between the potential of the p-type semiconductor substrate and the ground potential GND. As a result, both the p-channel MOS transistors 93a and 94a turn off, and the output of the control circuit 90 to the p-type semiconductor substrate exhibits a high impedance.

Similarly, when the enable control signal is H, the oscillator circuit 91b and the n-channel MOS transistors 93b, 94b behave to introduce electrons from the n-type semiconductor substrate to the driving power source $V_{DD}$. It results in elevating the potential of the n-type semiconductor substrate. When the enable control signal is L, the n-channel MOS transistors 93b and 94b turn off, and the output to the n-type semiconductor substrate exhibits a high impedance.

As explained above, unlike the first embodiment, the CMOS integrated circuit device according to the fourth embodiment need not connect by bonding the pad 2 to the power source pin and the pad 3 to the ground power source pin after inspection or before shipment of the product.

Needless to say, also the fourth embodiment attains the same effects as those of the first embodiment.

For inspecting the static power source current of the CMOS integrated circuit device according to the fourth embodiment, the driving power source $V_{DD}$ is applied to the pad 7, and the ground power source GND to the pad 8. Then, the enable control signal, referred to above, is applied to inactivate the control circuit 90. Thereafter, a higher potential than the potential of the driving power source $V_{DD}$ is applied to the pad 2, and a lower potential than the ground power source GND is applied to the pad 3. Under the condition, by monitoring the current flowing the pad 7 or pad 8, the CMOS integrated circuit is determined to be acceptable or unacceptable.

Figure 8:
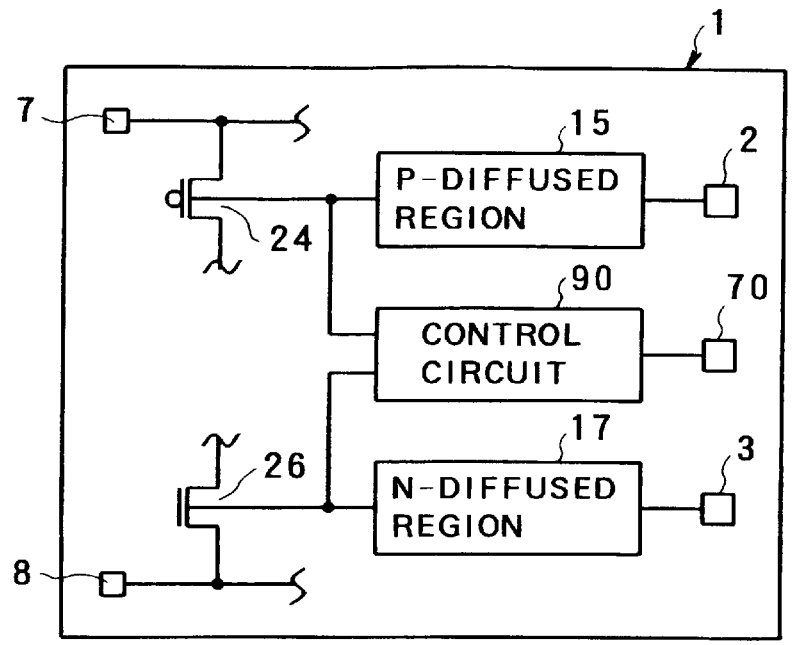
FIG. 8 is a diagram showing the general construction of a CMOS integrated circuit device taken as a fifth embodiment of the invention.

Next shown in FIG. 8 is an arrangement of the CMOS integrated circuit device according to the fifth embodiment of the invention. The CMOS integrated circuit device shown here includes a control circuit 90 in addition to the CMOS integrated circuit device according to the third embodiment shown in FIG. 4.

The same effects as those of the fourth embodiment are attained also by the CMOS integrated circuit device according to the fifth embodiment.

In the embodiment shown here, no problem occurs even when a potential is applied from the exterior to the pad 2 or pad 3 upon completion of the inspection or upon shipment of the product.

Figure 9:
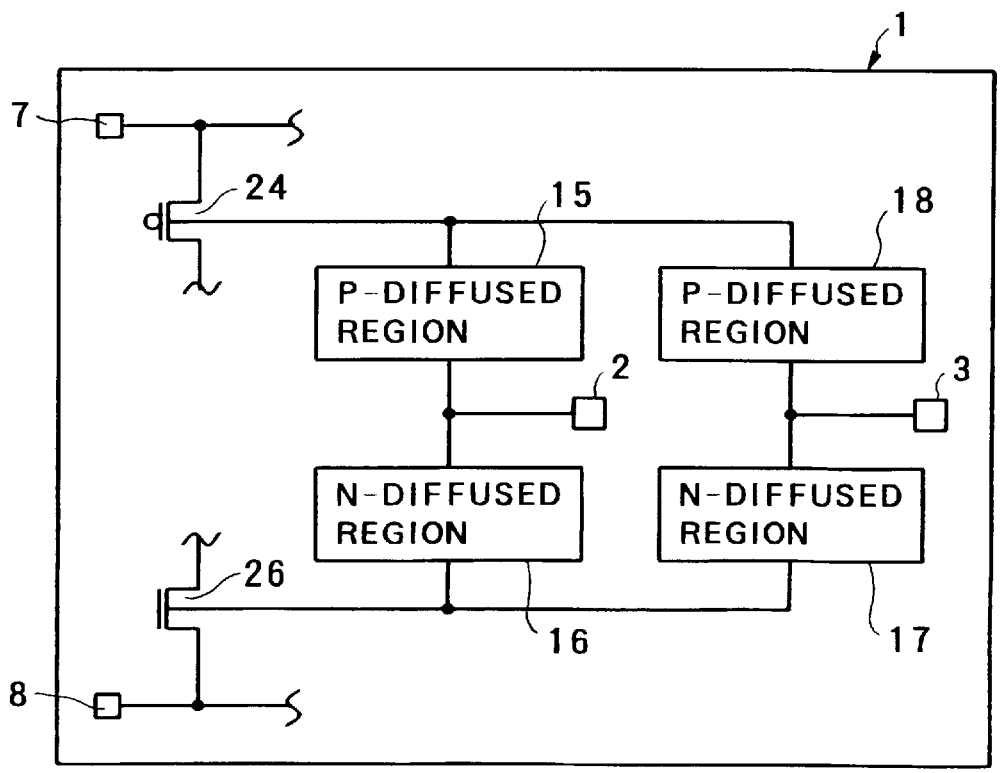
FIG. 9 is a diagram showing the general construction of a CMOS integrated circuit device taken as a sixth embodiment of the invention.

Next shown in FIG. 9 is an arrangement of the CMOS integrated circuit device according to the sixth embodiment of the invention. The CMOS integrated circuit device shown here includes an n-diffused region 16 and a p-diffused region 18 in addition to the CMOS integrated circuit device according to the third embodiment. The n-diffused region 16 is formed in the n-type semiconductor substrate having formed the n-channel MOS transistor 26, and it is connected to the pad 2. The p-diffused region 18 is formed in the p-type semiconductor substrate having formed the p-channel MOS transistor 24, and it is connected to the pad 3.

For inspecting the static power current of the CMOS integrated circuit device according to the sixth embodiment, a potential $V_{Nsub}+V_F$ (about 0.6V) is applied to the pad 2, and the a potential $V_{Psub}-V_F$ is applied to the pad 3, where $V_{Nsu}$ ($>V_{DD}$) is the potential applied to the n-type semiconductor substrate, and $V_{Psub}$ (<GND) is the potential applied to the p-type semiconductor substrate. $V_F$ is the built-in potential of the pn junction.

Similarly, the sixth embodiment can also elevate the threshold value of the MOS transistor during inspection of the static power source current, and promises accurate inspection of the static power source current and reliable removal of defective products.

Additionally, the CMOS integrated circuit device according to the sixth embodiment has a higher anti-latch-up property than that of the third embodiment.

Figure 10:
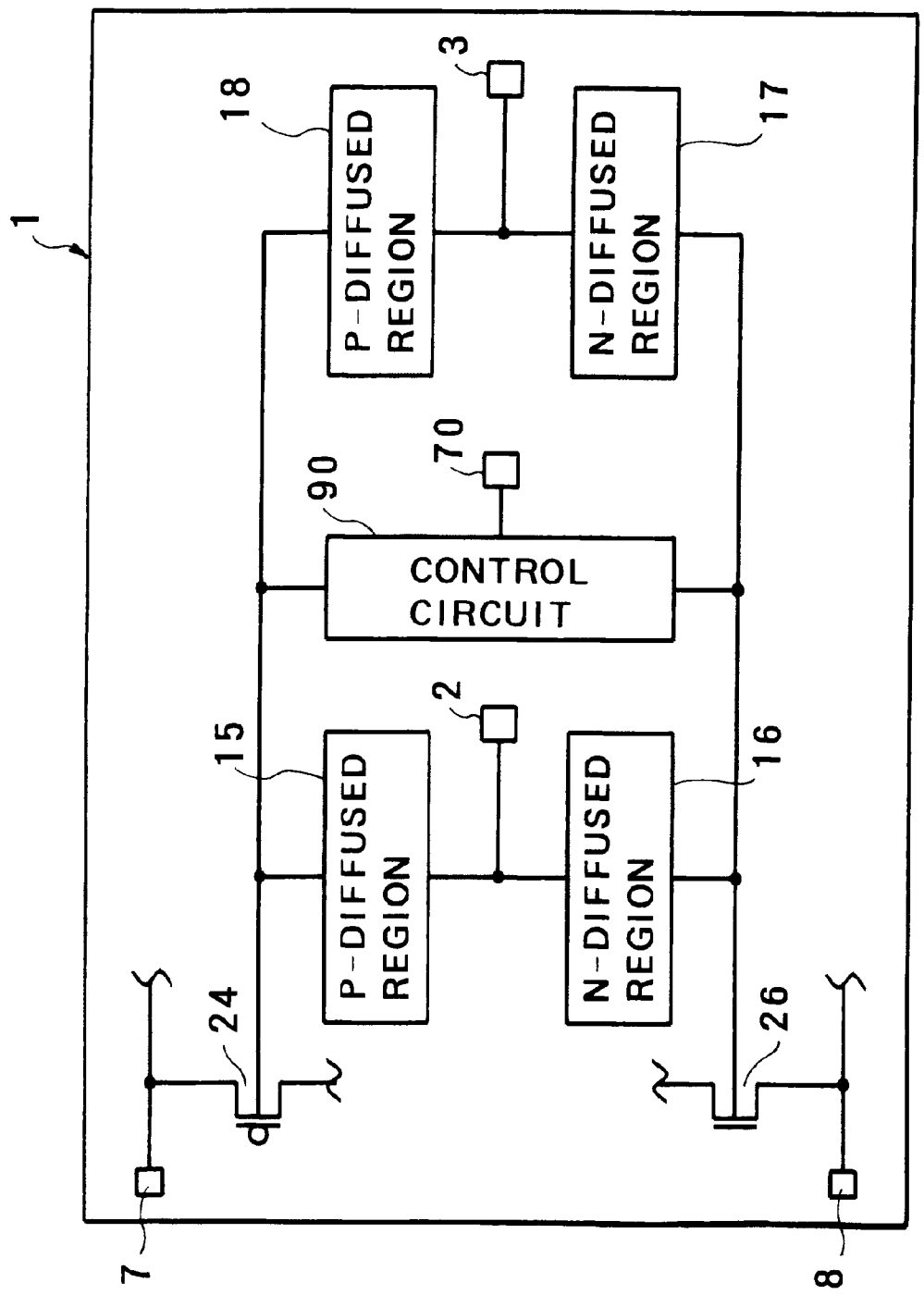
FIG. 10 is a diagram showing the general construction of a CMOS integrated circuit device taken as a seventh embodiment of the invention.

Next shown in FIG. 10 is an arrangement of the CMOS integrated circuit device according o the seventh embodiment of the invention. The CMOS integrated circuit device shown here includes the control circuit 90 explained above in addition to the CMOS integrated circuit device according to the sixth embodiment shown in FIG. 9.

Needless to say, also the CMOS integrated circuit device according to the seventh embodiment attains the same effects as those of the sixth embodiment. Additionally, since it includes the control circuit 90, no problem occurs even when a potential is applied from the exterior to the pad 2 or pad 3 upon completion of the inspection or upon shipment of the product.

Inspection of the static power source current of the CMOS integrated circuit device according to either the fifth embodiment and the seventh embodiment may be done in the same manner as the fourth embodiment.

The first to seventh embodiments have been explained as applying the driving power source $V_{DD}$ to the pad 7 and a higher potential than the driving power source potential $V_{DD}$ to the pad 7 during inspection of the CMOS integrated circuit device. However, it is also possible to apply a higher potential than the driving power source potential $V_{DD}$ to the pad 7 and a lower potential than the ground potential GND to the pad 8 during inspection. In this case, a higher potential than that applied to the pad 7 may be applied to the pad 2, and a lower potential than that applied to the pad 8 may be applied to the pad 3.

As described above, the invention promises accurate inspection of the static power source.

What is claimed is:

1. A CMOS integrated circuit device comprising:
   a CMOS circuit including a p-channel MOS transistor and an n-channel MOS transistor;
   a first pad connected to the source of said p-channel transistor;
   a second pad connected to the source of said n-channel MOS transistor;
   a p-type diffused region formed in an n-type substrate or n-well in which said p-channel MOS transistor is formed;
   an n-type diffused region formed in a p-type substrate or p-well in which said n-channel MOS transistor is formed;
   a third pad connected through said p-type diffused region to said n-type substrate or said n-well in which said p-channel MOS transistor is formed; and
   a fourth pad connected through said n-type diffused region to said p-type substrate or p-well in which said n-channel MOS transistor is formed.

2. The CMOS integrated circuit device according to claim 1 further comprising:
   a second p-type diffused region formed in said n-type substrate or n-well having formed said p-channel MOS transistor and connected to said fourth pad; and a second n-type diffused region formed in said p-type substrate or p-well having formed said n-channel MOS transistor and connected to said third pad.

3. The CMOS integrated circuit device according to claim 1 wherein said first pad is connected to be applied with a first power source potential, said second pad being connected to be applied with a second power source potential, said third pad being connected to be applied with a third power source potential, and said fourth pad being connected to be applied with a fourth power source potential.

4. The CMOS integrated circuit device according to claim 1 further comprising a control circuit activated by an enable control signal to elevate the potential of said n-type substrate or n-well having formed said p-channel MOS transistor and to lower the potential of said p-type substrate or p-well having formed said n-channel MOS transistor.

5. The CMOS integrated circuit device according to claim 2 wherein said pad is connected to be applied with a first power source potential, said second pad being connected to be applied with a second power source potential, said third pad being connected to be applied with a third power source potential, and said fourth pad being connected to be applied with a fourth power source potential.

6. The CMOS integrated circuit device according to claim 2 further comprising a control circuit activated by an enable control signal to elevate the potential of said n-type substrate or n-well having formed said p-channel MOS transistor and to lower the potential of said p-type substrate or p-well having formed said n-channel MOS transistor.

7. A CMOS integrated circuit device comprising:
  a CMOS circuit including a p-channel MOS transistor and an n-channel MOS transistor;
  a first pad connected to the source of said p-channel transistor;
  a second pad connected to the source of said n-channel MOS transistor;
  a third pad connected to an n-type substrate or n-well in which said p-channel MOS transistor is formed;
  a fourth pad connected to a p-type substrate or p-well in which said n-channel MOS transistor is formed; and
  a control circuit activated by an enable control signal to elevate the potential of said n-type substrate or n-well having formed said p-channel MOS transistor and to lower the potential of said p-type substrate or p-well having formed said n-channel MOS transistor.

8. A method for inspecting a CMOS integrated circuit device having a CMOS circuit including a p-channel MOS transistor and an n-channel MOS transistor; a first pad connected to the source of said p-channel transistor; a second pad connected to the source of said n-channel MOS transistor; a p-type diffused region formed in an n-type substrate or n-well in which said p-channel MOS transistor is formed; an n-type diffused region formed in a p-type substrate or p-well in which said n-channel MOS transistor is formed; a third pad connected through said p-type diffused region to an n-type substrate or an n-well in which said p-channel MOS transistor is formed; and a fourth pad connected through said n-type diffused region to said p-type substrate or p-well in which said n-channel MOS transistor is formed, comprising:
  determining whether said CMOS integrated circuit device is acceptable or not with reference to a current flowing in said first or second pad under a condition made for inspection by applying a first power source potential to said first pad, applying a second power source potential lower than said first source power potential to said second pad, applying a potential higher than said first power source potential to said third pad, and applying a potential lower than said second power source potential to said fourth pad.

9. A method for inspecting a CMOS integrated circuit device having a CMOS circuit including a p-channel MOS transistor and an n-channel MOS transistor; a first pad connected to the source of said p-channel transistor; a second pad connected to the source of said n-channel MOS transistor; a p-type diffused region formed in an n-type substrate or n-well in which said p-channel MOS transistor is formed; an n-type diffused region formed in a p-type substrate or p-well in which said n-channel MOS transistor is formed; a third pad connected through said p-type diffused region to an n-type substrate or an n-well in which said p-channel MOS transistor is formed; a fourth pad connected through said n-type diffused region to said p-type substrate or p-well in which said n-channel MOS transistor is formed; a second p-type diffused region formed in said n-type substrate or n-well having formed said p-channel MOS transistor and connected to said fourth pad; and a second n-type diffused region formed in said p-type substrate or p-well having formed said n-channel MOS transistor and connected to said third pad; comprising:
  determining whether said CMOS integrated circuit device is acceptable or not with reference to a current flowing in said first or second pad under a condition made for inspection by applying a first power source potential to said first pad, applying a second power source potential lower than said first source power potential to said second pad, applying a potential higher than said first power source potential to said third pad, and applying a potential lower than said second power source potential to said fourth pad.

10. A method for inspecting a CMOS integrated circuit device having a CMOS circuit including a p-channel MOS transistor and an n-channel MOS transistor; a first pad connected to the source of said p-channel transistor; a second pad connected to the source of said n-channel MOS transistor; a p-type diffused region formed in an n-type substrate or n-well in which said p-channel MOS transistor is formed; an n-type diffused region formed in a p-type substrate or p-well in which said n-channel MOS transistor is formed; a third pad connected through said p-type diffused region to an n-type substrate or an n-well in which said p-channel MOS transistor is formed; a fourth pad connected through said n-type diffused region to said p-type substrate or p-well in which said n-channel MOS transistor is formed; and a control circuit activated by an enable control signal to elevate the potential of said n-type substrate or n-well having formed said p-channel MOS transistor and to lower the potential of said p-type substrate or p-well having formed said n-channel MOS transistor; comprising:
  determining whether said CMOS integrated circuit device is acceptable or not with reference to a current flowing in said first or second pad under a condition made for inspection by first applying a first power source potential to said first pad and applying a second power source potential lower than said first source power potential to said second pad, next inactivating said control circuit in response to said enable control signal, and thereafter applying a potential higher than said first power source potential to said third pad and applying a potential lower than said second power source potential to said fourth pad.

11. A method for inspecting a CMOS integrated circuit device having a CMOS circuit including a p-channel MOS transistor and an n-channel MOS transistor; a first pad connected to the source of said p-channel transistor; a second pad connected to the source of said n-channel MOS transistor; a p-type diffused region formed in an n-type substrate or n-well in which said p-channel MOS transistor is formed; an n-type diffused region formed in a p-type substrate or p-well in which said n-channel MOS transistor is formed; a third pad connected through said p-type diffused region to an n-type substrate or an n-well in which said p-channel MOS transistor is formed; a fourth pad connected through said n-type diffused region to said p-type substrate or p-well in which said n-channel MOS transistor is formed; a second p-type diffused region formed in said n-type substrate or n-well having formed said p-channel MOS transistor and connected to said fourth pad; a second n-type diffused region formed in said p-type substrate or p-well having formed said n-channel MOS transistor and connected to said third pad; and a control circuit activated by an enable control signal to elevate the potential of said n-type substrate or n-well having formed said p-channel MOS transistor and to lower the potential of said p-type substrate or p-well having formed said n-channel MOS transistor; comprising:

determining whether said CMOS integrated circuit device is acceptable or not with reference to a current flowing in said first or second pad under a condition made for inspection by first applying a first power source potential to said first pad and applying a second power source potential lower than said first source power potential to said second pad, next inactivating said control circuit in response to said enable control signal, and thereafter applying a potential higher than said first power source potential to said third pad and applying a potential lower than said second power source potential to said fourth pad.

12. A method for inspecting a CMOS integrated circuit device having a CMOS circuit including a p-channel MOS transistor and an n-channel MOS transistor; a first pad connected to the source of said p-channel transistor; a second pad connected to the source of said n-channel MOS transistor; a third pad connected through said p-type diffused region to an n-type substrate or an n-well in which said p-channel MOS transistor is formed; a fourth pad connected through said n-type diffused region to said p-type substrate or p-well in which said n-channel MOS transistor is formed; and a control circuit activated by an enable control signal to elevate the potential of said n-type substrate or n-well having formed said p-channel MOS transistor and to lower the potential of said p-type substrate or p-well having formed said n-channel MOS transistor; comprising:

determining whether said CMOS integrated circuit device is acceptable or not with reference to a current flowing in said first or second pad under a condition made for inspection by first applying a first power source potential to said first pad and applying a second power source potential lower than said first source power potential to said second pad, next inactivating said control circuit in response to said enable control signal, and thereafter applying a potential higher than said first power source potential to said third pad and applying a potential lower than said second power source potential to said fourth pad.

* * * * *